United States Patent
Kim et al.

(10) Patent No.: US 8,089,797 B2
(45) Date of Patent: Jan. 3, 2012

(54) INFORMATION STORAGE DEVICES INCLUDING VERTICAL NANO WIRES

(75) Inventors: Ho-jung Kim, Suwon-si (KR);
Jai-kwang Shin, Anyang-si (KR);
Sun-ae Seo, Hwaseong-si (KR);
Sung-chul Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 107 days.

(21) Appl. No.: 12/659,515

(22) Filed: Mar. 11, 2010

(65) Prior Publication Data
US 2011/0063885 A1  Mar. 17, 2011

(30) Foreign Application Priority Data
Sep. 16, 2009 (KR) .................. 10-2009-0087640

(51) Int. Cl.
*G11C 19/00* (2006.01)
(52) U.S. Cl. ............... 365/80; 365/185.05; 365/189.14
(58) Field of Classification Search ............... 365/80, 365/185.05, 189.14
See application file for complete search history.

(56) References Cited

U.S. PATENT DOCUMENTS

| 5,594,698 A * | 1/1997 | Freeman ................. 365/222 |
| 7,606,065 B2 * | 10/2009 | Fontana et al. ........... 365/173 |
| 2008/0025069 A1 * | 1/2008 | Scheuerlein et al. ...... 365/148 |
| 2008/0137389 A1 | 6/2008 | Hwang et al. |

FOREIGN PATENT DOCUMENTS

| JP | 2008/090957 | 4/2008 |
| KR | 10-0695171 | 3/2007 |
| KR | 10-2007-0108054 | 11/2007 |
| KR | 10-2009-0040042 | 4/2009 |

* cited by examiner

*Primary Examiner* — Tuan T. Nguyen
(74) *Attorney, Agent, or Firm* — Harness, Dickey & Pierce, P.L.C.

(57) ABSTRACT

A memory cell includes: a memory cell array unit having a plurality of nano wires arranged vertically on a substrate, each of the plurality of nano wires having a plurality of domains for storing information; a nano wire selection unit formed on the substrate and configured to select at least one of the plurality of nano wires; a domain movement control unit formed on the substrate and configured to control a domain movement operation with respect to at least one of the plurality of nano wires; and a read/write control unit formed on the substrate and configured to control at least one of a read operation and a write operation with respect to at least one of the plurality of nano wires.

21 Claims, 10 Drawing Sheets

INFORMATION STORAGE DEVICES INCLUDING VERTICAL NANO WIRES

CROSS-REFERENCE TO RELATED APPLICATION(S)

This application claims priority under 35 U.S.C. §119 to Korean Patent Application No. 10-2009-0087640, filed on Sep. 16, 2009, in the Korean Intellectual Property Office, the entire contents of which is incorporated herein by reference.

BACKGROUND

1. Field

Example embodiments relate to information storage devices including vertical nano wires and methods of operating the same.

2. Description of the Related Art

Nonvolatile information storage devices retain recorded information even if power is cut off. Conventional types of nonvolatile information storage devices include, for example, hard disk drives (HDDs) and nonvolatile random access memory (RAMs). A conventional HDD has a rotating part, which wears down relatively easily thereby increasing the likelihood of failure. Also, because failure of conventional HDDs is more likely, reliability of conventional HDDs is relatively low.

An example of a conventional nonvolatile RAM is a flash memory. Conventional flash memories do not include a rotating part, but have relatively slow read/write operation speeds, relatively short life spans and relatively low data storage capacities relative to conventional HDDs. Conventional flash memories also have relatively high manufacturing costs.

SUMMARY

Example embodiments provide relatively highly integrated and relatively high capacity nonvolatile information storage devices including memory cell areas implemented using vertical nano wire structures.

Additional aspects will be set forth in part in the description which follows and, in part, will be apparent from the description, or may be learned by practice of the presented example embodiments.

At least one example embodiment provides a memory cell. According to at least this example embodiment, the memory cell includes a memory cell array unit having a plurality of nano wires arranged vertically on a substrate. Each of the plurality of nano wires includes a plurality of domains for storing information. The memory cell further includes a nano wire selection unit formed on the substrate. The nano wire selection unit is configured to select at least one of the plurality of nano wires. Still further, the memory cell includes: a domain movement control unit and a read/write control unit. The domain movement control unit is formed on the substrate and configured to control a domain movement operation with respect to at least one of the plurality of nano wires. The read/write control unit is formed on the substrate and configured to control at least one of a read operation and a write operation with respect to at least one of the plurality of nano wires.

According to at least some example embodiments, the nano wire selection unit may provide a selection signal to the plurality of nano wires through a plurality of selection signal lines to select the at least one of the plurality of nano wires. The domain movement control unit may provide a domain movement signal in the form of a control voltage or a control current to the plurality of nano wires through a plurality of domain movement signal lines to control the domain movement operation of at least one of the plurality of nano wires. The read/write control unit may provide a read/write signal to the plurality of nano wires through a plurality of read/write signal lines to control at least one of the read and write operations with respect to at least one of the plurality of nano wires.

The plurality of selection signal lines may be arranged vertically with respect to the plurality of read/write signal lines. The plurality of selection signal lines may be arranged vertically with respect to the plurality of domain movement signal lines. The plurality of domain movement signal lines may be arranged vertically with respect to the plurality of read/write signal lines.

The selection signal lines of the first and second groups may be arranged alternately. For example, the selection signal lines of the first group may be even-numbered ones of the plurality of selection signal lines, whereas the selection signal lines of the second group may be odd-numbered ones of the plurality of selection signal lines.

According to at least some example embodiments, the domain movement control unit may include: a first domain movement control unit and a second domain movement control unit. The first domain movement control unit may be arranged close to or at a first surface or side of the memory cell array unit and connected to domain movement signal lines of a first group of the plurality of domain movement signal lines. The second domain movement control unit may be arranged close to or at a second surface or side of the memory cell array unit and connected to domain movement signal lines of a second group of the plurality of domain movement signal lines. The second domain movement control unit may not be connected to the domain movement signal lines of the first group. The first surface or side and the second surface or side may face each other with respect to the memory cell array unit.

The domain movement signal lines of the first and second groups may be arranged alternately. In one example, the domain movement signal lines of the first group may be even-numbered ones of the plurality of domain movement signal lines, whereas the domain movement signal lines of the second group may be odd-numbered ones of the plurality of domain movement signal lines.

The read/write signal lines of the first and second groups may be arranged alternately. For example, the read/write signal lines of the first group may be even-numbered ones of the plurality of read/write signal lines, whereas the read/write signal lines of the second group may be odd-numbered ones of the plurality of read/write signal lines.

According to at least some example embodiments, memory cells may further include: a plurality of domain movement transistors and a plurality of read/write transistors. The plurality of domain movement transistors may be formed on the substrate and connected to each of the plurality of nano wires. Sources of the plurality of domain movement transistors may share a first source line. The plurality of read/write transistors may be formed on the substrate to be connected to each of the plurality of nano wires. Sources of the plurality of read/write transistors may share a second source line. The nano wire selection unit may provide the selection signal to the nano wires of at least one column of the plurality of nano wires and activate, simultaneously and/or concurrently, the plurality of domain movement transistors and the plurality of read/write transistors connected to each of the nano wires of the at least one column.

The domains included in each of the plurality of nano wires may be magnetic domains arranged parallel or substantially parallel to the substrate.

At least one other example embodiment provides an information storage device including a memory core unit and a peripheral circuit. The memory core unit includes: a plurality of memory cell array units; a plurality of nano wire selection units; a plurality of domain movement control units; and a plurality of read/write control units. The peripheral circuit unit is connected to the memory core unit. Each of the plurality of memory cell array units includes a plurality of nano wires arranged vertically on a substrate, and each of the plurality of nano wires includes a plurality of domains for storing information. Each of the plurality of nano wire selection units is configured to select at least one of the plurality of nano wires included in at least one of the plurality of memory cell array units. Each of the plurality of domain movement control units is configured to control a domain movement operation with respect to at least one of the plurality of nano wires included in at least one of the plurality of memory cell array units. Each of the plurality of read/write control units is configured to control at least one of a read operation and a write operation with respect to at least one of the plurality of nano wires included in at least one of the plurality of memory cell array units.

According to at least some example embodiments, pairs of the plurality of memory cell array units may share one of the plurality of nano wire selection units in a first direction, and pairs of the plurality of memory cell array units may share one of the plurality of domain movement control units or one of the plurality of read/write control units in a second direction, which is perpendicular to the first direction.

At least one other example embodiment provides an information storage device including a memory core unit and a peripheral circuit. The memory core unit includes: a plurality of memory cell array units; a plurality of nano wire selection units; a domain movement control unit; a read/write control unit; and a plurality of activation decoders. The peripheral circuit unit is connected to the memory core unit. Each of the plurality of memory cell array units includes a plurality of nano wires arranged vertically on a substrate, and each of the plurality of nano wires includes a plurality of domains for storing information. Each of the plurality of nano wire selection units is configured to provide a selection signal to select at least one of the plurality of nano wires included in at least one of the plurality of memory cell array units. The domain movement control unit is configured to provide a domain movement signal to at least one of the plurality of activation decoders to control a domain movement operation of at least one of the plurality of nano wires included in at least one of the plurality of memory cell array units. The read/write control units is configured to provide a read/write signal to at least one of the plurality of activation decoders to control at least one of a read operation and a write operation with respect to at least one of the plurality of nano wires included in at least one of the plurality of memory cell array units.

According to at least some example embodiments, the plurality of activation decoders may be configured to perform a first decoding on the domain movement control signal or the read/write signal, and to provide a first decoded signal to a corresponding memory cell array unit. Pairs of the plurality of memory cell array units may share one of the plurality of nano wire selection units in a first direction, and pairs of the plurality of memory cell array units may also share one of the plurality of activation decoders in a second direction, which is perpendicular to the first direction.

At least one other example embodiment provides a memory card including a memory unit including the above-described memory cell, and a controller unit configured to control the memory unit.

At least one other example embodiment provides an electronic system including a memory unit including the above-described memory cell, a processor unit communicating with the memory unit via a bus, and an input/output device communicating with the bus.

BRIEF DESCRIPTION OF THE DRAWINGS

Example embodiments will become apparent and more readily appreciated from the following description of the accompanying drawings in which.

DETAILED DESCRIPTION

Figure 1:
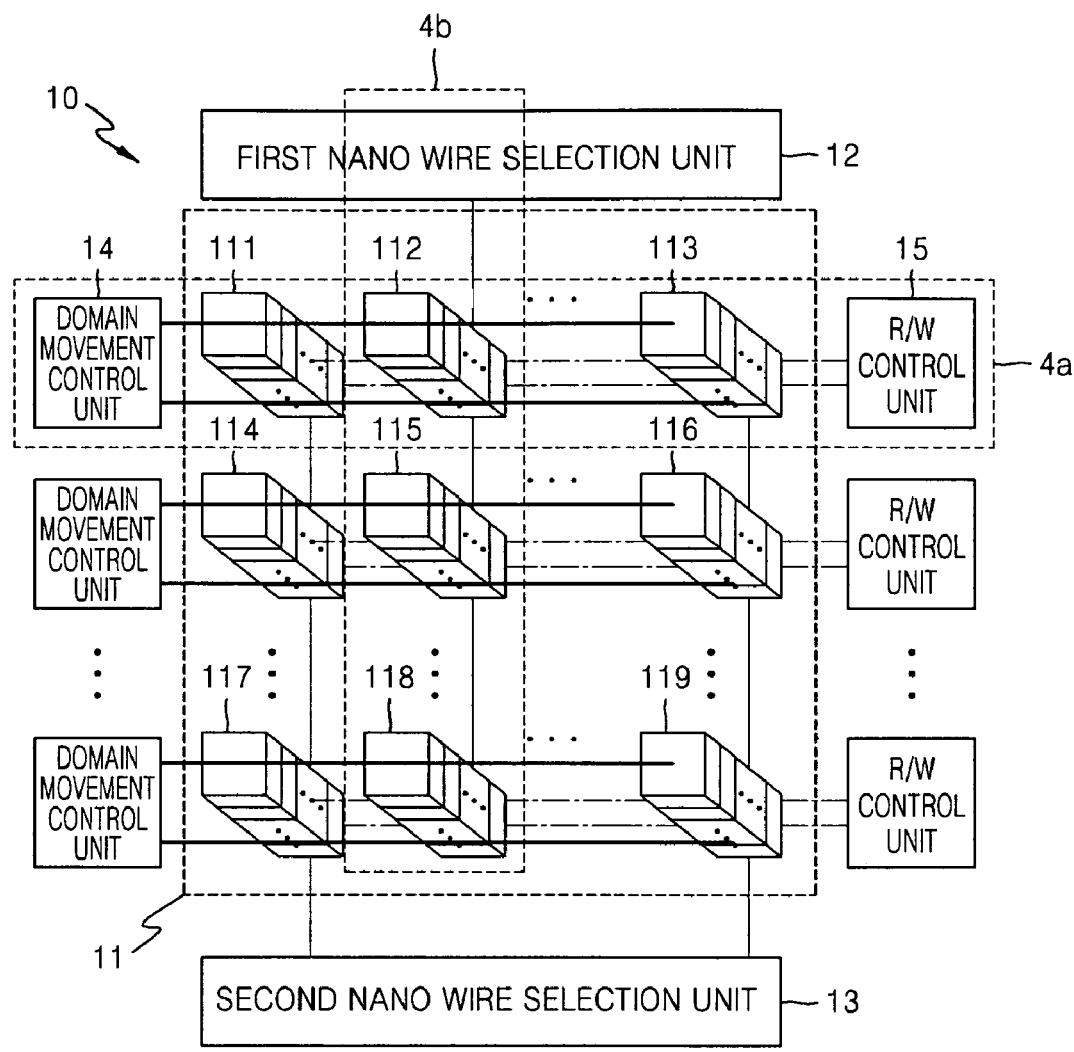
FIG. 1 illustrates a memory cell of an information storage device according to an example embodiment.

Example embodiments of inventive concepts will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Inventive concepts may, however, may be embodied in many alternate forms and should not be construed as limited to only the example embodiments set forth herein.

It should be understood that there is no intent to limit the inventive concepts to the particular example embodiments disclosed, but on the contrary example embodiments are to cover all modifications, equivalents, and alternatives. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made in detail to embodiments, examples of which are illustrated in the accompanying drawings, wherein like reference numerals refer to the like elements throughout.

FIG. 1 illustrates a memory cell 10 of an information storage device according to an example embodiment.

Referring to FIG. 1, the memory cell 10 includes: a memory cell array unit 11, first and second nano wire selection units 12 and 13, a plurality of domain movement control units 14, and a plurality of read/write (R/W) control units 15, which are formed on and/or above a substrate (not shown). The substrate may be a semiconductor substrate and may include, for example, any one of silicon (Si), silicon-on-insulator, silicon-on-sapphire, germanium (Ge), silicon-germanium (SiGe), gallium-arsenide (GaAs), and the like.

The memory cell array unit 11 includes a plurality of nano wires 111-119 that are arranged vertically on the substrate. The nano wires 111-119 form an array including N-number of rows and M-number of columns, where "N" and "M" are natural numbers. Although the number of nano wires to be included in the memory cell array unit 11 may vary, nine (9) nano wires are illustrated in FIG. 1 for convenience of explanation. A method of vertically forming the nano wires 111-119 on the substrate may be variously modified according to example embodiments. For example, the nano wires 111-119 may be vertically formed by arranging metal particles (e.g., platinum (Pt) or the like) on the substrate. In another example, the nano wires 111-119 may be vertically formed by depositing a given, desired or predetermined thin film on the substrate and annealing the thin film.

Each of the nano wires 111-119 has a plurality of domains (e.g., magnetic domains) to store information. While the nano wires 111-119 are formed perpendicularly or substantially perpendicularly to the substrate, alternatively the domains may be formed in a direction parallel or substantially parallel to the substrate. In the following description, the information storage device will be described assuming that the domains are magnetic domains. However, example embodiments are not limited thereto and may be applied to other information storage devices that are implemented by using nano wires.

In at least this example, the nano wires 111-119 may be formed of a ferromagnetic material. When an external, relatively strong magnetic field is applied, the ferromagnetic material is magnetized relatively strongly and maintains the magnetization after the external magnetic field is removed. The ferromagnetic material signifies a material having characteristics of a magnet. Example ferromagnetic materials include: iron (Fe), cobalt (Co), nickel (Ni), an alloy thereof, or the like. Small magnetic regions forming the ferromagnetic material are referred to as magnetic domains. A boundary portion between each pair of adjacent magnetic domains, which is magnetized in an opposite direction, is referred to as a magnetic domain wall. The magnetic domains and the magnetic domain walls may be moved by applying current to a magnetic layer. To perform a read and/or write (R/W) operation on the magnetic domains, an R/W unit (not shown) is arranged to correspond to a single nano wire, which will be described later.

Still referring to FIG. 1, the first and second nano wire selection units 12 and 13 may select at least one of the nano wires 111-119 included in the memory cell array unit 11 in response to an externally received address.

In more detail, for example, the first and second nano wire selection units 12 and 13 are formed on the substrate and connected to the nano wires 111-119 through a plurality of selection signal lines. The first and second nano wire selection units 12 and 13 are configured to provide a selection signal to select at least one of the nano wires 111-119. The selection signal lines may be word lines. The selection signal lines may be formed to correspond to the number of columns of the nano wires 111-119. For example, if the memory cell array unit 11 includes M columns of nano wires, the number of the selection signal lines is M. The nano wires included in the same column are connected to the same selection signal lines.

Still referring to FIG. 1, the first nano wire selection unit 12 is formed relatively close to or at a first surface or side of the memory cell array unit 11. The second nano wire selection unit 13 is formed relatively close to or at a second surface or side of the memory cell array unit 11. The first nano wire selection unit 12 and the second nano wire selection unit 13 are formed to face each other with respect to the memory cell array unit 11. In the example embodiment shown in FIG. 1, the first nano wire selection unit 12 is formed relatively close to the nano wires 111, 112, and 113 of the first row of the nano wires, and the first nano wire selection unit 12 is connected to the selection signal lines in a first group of the selection signal lines.

The second nano wire selection unit 13 is formed relatively close to the nano wires 117, 118, and 119 of the N-th row of the nano wires, and is connected to the selection signal lines in a second group of the selection signal lines.

In this example, the selection signal lines of the first group include even-numbered ones of the selection signal lines, whereas the selection signal lines of the second group include odd-numbered ones of the selection signal lines. However, example embodiments are not limited thereto. In at least one other example embodiment, of the selection signal lines of the first through M-th columns, the selection signal lines of the first through the M/2-th columns may be included in the first group, whereas the selection signal lines of the [(M/2)+1]-th through the M-th columns may be included in the second group.

According to at least this example embodiment, the first and second nano wire selection units 12 and 13 are formed to face each other with respect to the memory cell array unit 11. In this case, each of the first and second nano wire selection units 12 and 13 may control half or about half of the nano wires included in the memory cell array unit 11. Accordingly, as the number of the nano wires controlled by each of the nano wire selection units 12 and 13 decreases, the complexity of each of the nano wire selection units 12 and 13 may be reduced and/or the area taken by the nano wire selection units 12 and 13 relative to the entire area of the storage device may be reduced.

Although the memory cell 10 of FIG. 1 is discussed as including only two of the first and second nano wire selection units 12 and 13, in at least one other example embodiment the memory cell 10 may include a number of nano wire selection units corresponding to the number of the selection signal lines. The nano wire selection unit corresponding to each of the even-numbered selection signal lines may be formed relatively close to or at the first surface or side of the memory cell array unit 11, whereas the nano wire selection unit corresponding to each of the odd-numbered selection signal lines may be formed relatively close to or at the second surface or side of the memory cell array unit 11.

Still referring to FIG. 1, the domain movement control units 14 are formed on the substrate and connected to the nano wires 111-119 through a plurality of domain movement signal lines. The domain movement control units 14 are configured to provide a control voltage or a control current as a domain movement signal to control a domain movement operation of at least one of the nano wires 111-119. In the example embodiment shown in FIG. 1, the memory cell 10 includes a number of domain movement control units 14 corresponding to the number of rows of the nano wires of the memory cell array unit 11. However, in at least one other example embodiment, the memory cell 10 may include a single domain movement control unit.

The domain movement control units 14 are formed close to or at a third surface or side of the memory cell array unit 11. The third surface or side is perpendicular or substantially perpendicular to each of the first and second surfaces. The domain movement signal lines may be arranged perpendicular or substantially perpendicular to the selection signal lines. Each of the domain movement control units 14 is connected to the nano wires in the same row through a pair of the domain movement signal lines (e.g., first and second domain movement signal lines). For example, the domain movement control units 14 are connected to the nano wires 111, 112, and 113 of the first row through a pair of the domain movement signal lines. The domain movement control units 14 may provide a current pulse or a voltage pulse having a given, desired or predetermined pulse number, as a domain movement signal, to the nano wires 111, 112, and 113 of the first row. The magnetic domains of each of the nano wires 111, 112, and 113 of the first row move according to the current pulse.

Still referring to FIG. 1, the R/W control units 15 are formed on the substrate and connected to the nano wires 111-119 through a plurality of R/W signal lines. The R/W control units 15 are configured to provide an R/W signal to at least one of the nano wires 111-119 to control a read operation and/or a write operation. Although in FIG. 1 the memory cell 10 includes a number of R/W control units 14 corresponding to the number of rows of the nano wires included in the memory cell array unit 11, in other example embodiments the memory cell 10 may include a single R/W control unit.

The R/W control units 15 are formed relatively close to or at a fourth surface or side of the memory cell array unit 11. The fourth surface or side is arranged to face the third surface or side. The R/W signal lines may be arranged to be perpendicular or substantially perpendicular to the selection signal lines, but parallel or substantially parallel to the domain movement signal lines. Each of the R/W control units 15 is connected to the nano wires in the same row through a pair of the R/W signal lines (e.g., first and second R/W signal lines). For example, the R/W control units 15 are connected to the nano wires 111, 112, and 113 of the first row through a pair of the R/W signal lines. The R/W signal lines may be bit lines.

In more detail, the R/W control units 15 are configured to transfer write data to the nano wires 111-119 of the memory cell array unit 11, or to receive data read out from the nano wires 111-119 of the memory cell array unit 11. The operation of the R/W control units 15 will be described below in more detail.

Each of the R/W control units 15 may include a write driver (not shown), a sense amplifier (not shown), and a latch (not shown). During a data write operation, the write data stored in the latch is provided to the write driver. The write driver generates a write current in response to the write data. In doing so, the magnetic domains are magnetized in opposite directions according to the direction of the write current.

During a data read operation, a reference current for the data read operation is provided to the magnetic domains through a pair of R/W signal lines. The sense amplifier compares the voltages of the magnetic domains with the reference voltage to sense data stored in the magnetic domains. The sensed data is temporarily stored in the latch and the data stored in the latch is provided to the outside as the read data.

Figure 2:
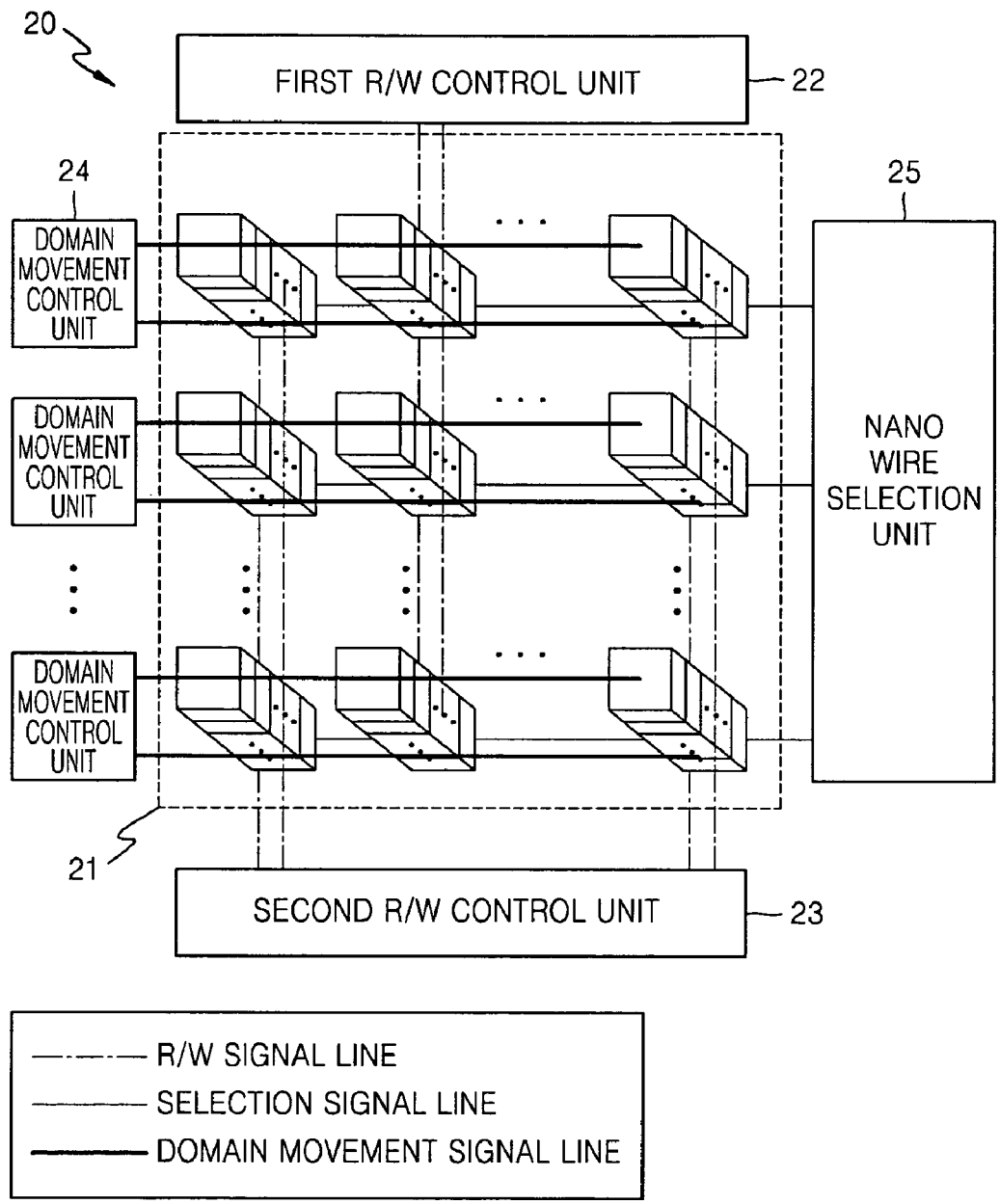
FIG. 2 illustrates a memory cell of an information storage device according to another example embodiment.

FIG. 2 illustrates a memory cell 20 of an information storage device according to another example embodiment.

Referring to FIG. 2, the memory cell 20 includes: a memory cell array unit 21, first and second read/write (R/W) control units 22 and 23, a plurality of domain movement control units 24, and a nano wire selection unit 25. The example embodiment shown in FIG. 2 will be described based mainly on the differences between the memory cell 20 and the memory cell 10 of FIG. 1. Thus, although not specifically presented below, the descriptions regarding the memory cell 10 of FIG. 1 may be equally applicable to the memory cell 20.

In FIG. 2, the first R/W control unit 22 is formed relatively close to or at a first surface or side of the memory cell array unit 21. The second R/W control unit 23 is formed relatively close to or at a second surface or side of the memory cell array unit 21. The first and second R/W control units 22 and 23 are arranged to face each other with respect to the memory cell array unit 21. The domain movement control units 24 are formed relatively close to or at a third surface or side of the memory cell array unit 21. The nano wire selection unit 25 is formed relatively close to or at a fourth surface or side of the memory cell array unit 21. The domain movement control units 24 and the nano wire selection unit 25 are arranged to face each other with respect to the memory cell array unit 21.

The memory cell 20 includes a number of R/W signal line pairs corresponding to the number of columns of nano wires of the memory cell array unit 21. For example, if the memory cell array unit 21 includes M rows of nano wires, the number of the R/W signal line pairs is M and the number of the R/W signal lines is 2M. Accordingly, the nano wires included in the same column are connected to the same pairs of the R/W signal lines.

Also, the first R/W control unit 22 is connected to the R/W signal line pairs of a first group of the R/W signal line pairs, whereas the second R/W control unit 23 is connected to the R/W signal line pairs of a second group of the R/W signal line pairs. In this example, the R/W signal line pairs of the first group are even-numbered ones of the R/W signal line pairs, whereas the R/W signal line pairs of the second group are odd-numbered ones of the R/W signal line pairs. However, example embodiments are not limited thereto. Rather, in other example embodiments, the R/W signal line pairs of the first through the M/2-th columns may be included in the first group and the R/W signal line pairs of the [(M/2)+1]-th through the M-th columns may be included in the second group.

According to at least the example embodiment shown in FIG. 2, when the first and second RAN control units 22 and 23 are formed to face each other with respect to the memory cell array unit 21, each of the first and second R/W control units 22 and 23 may control half or about half of the nano wires included in the memory cell array unit 21. Accordingly, as the number of the nano wires to be controlled by each R/W control unit decreases, the complexity of each R/W control unit may be reduced and/or the area taken by the R/W control unit relative to the entire area of the storage device may be reduced.

Although the example embodiment of the memory cell 20 includes only two of the first and second R/W control units 22 and 23, in other example embodiments the memory cell 20 may include a number of R/W control units corresponding to the number of the R/W signal line pairs. In this example, the R/W control units corresponding to the even-numbered R/W signal line pairs are formed relatively close to or at the first surface or side of the memory cell array unit 21, whereas the R/W control units corresponding to the odd-numbered R/W signal line pairs are formed relatively close to or at the second surface or side of the memory cell array unit 21.

Figure 3:
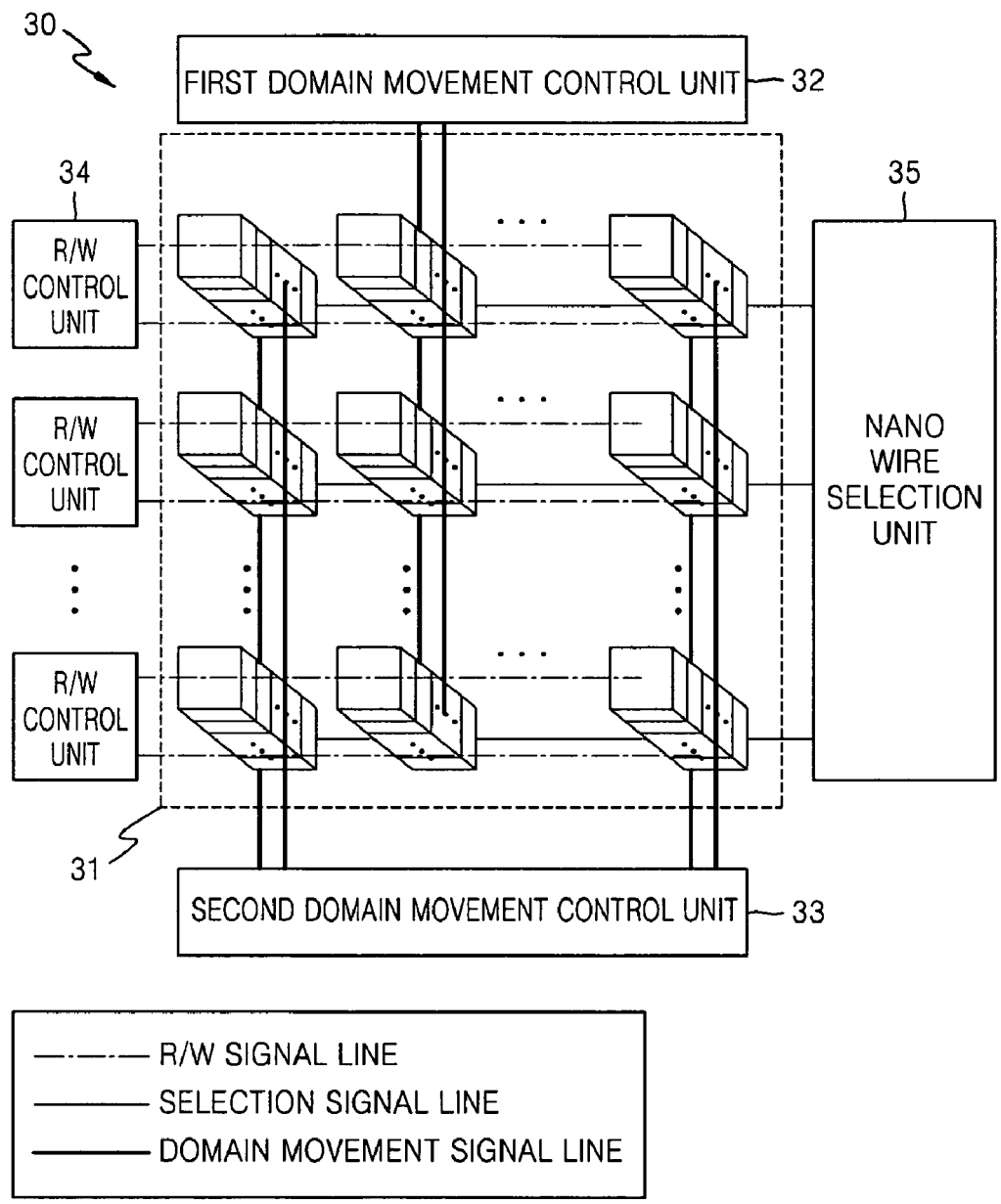
FIG. 3 illustrates a memory cell of an information storage device according to yet another example embodiment.

FIG. 3 illustrates a memory cell 30 of an information storage device according to another example embodiment.

Referring to FIG. 3, the memory cell 30 includes: a memory cell array unit 31, first and second domain movement control units 32 and 33, a plurality of read/write (R/W) control units 34, and a nano wire selection unit 35. In the following description, the example embodiment shown in FIG. 3 will be described based mainly on the differences between the memory cell 30 and the memory cell 10 of FIG. 1. Thus, although not presented below, descriptions regarding the memory cell 10 of FIG. 1 may be equally applicable to the memory cell 30.

In FIG. 3, the first domain movement control unit 32 is formed relatively close to or at a first surface or side of the memory cell array unit 31. The second domain movement control unit 33 is formed relatively close to or at a second surface or side of the memory cell array unit 31. The first and second domain movement control units 32 and 33 are arranged to face each other with respect to the memory cell array unit 31. The R/W control units 34 are formed relatively close to or at a third surface or side of the memory cell array unit 31. The nano wire selection unit 35 is formed relatively close to or at a fourth surface or side of the memory cell array unit 31. The R/W control units 34 and the nano wire selection unit 35 are arranged to face each other with respect to the memory cell array unit 31.

The memory cell 30 further includes a number of domain movement signal line pairs corresponding to the number of rows of nano wires included in the memory cell array unit 31. For example, if the memory cell array unit 31 includes M rows of nano wires, the number of the domain movement signal line pairs is M and the number of the domain movement signal lines is 2M. Accordingly, the nano wires included in the same column are connected to the same pairs of the domain movement signal lines.

Still referring to FIG. 3, the first domain movement control unit 32 is connected to the domain movement signal line pairs of a first group of the domain movement signal line pairs, whereas the second domain movement control unit 33 is connected to the domain movement signal line pairs of a second group of the domain movement signal line pairs. In this example, the domain movement signal line pairs of the first group are even-numbered one of the domain movement signal line pairs, whereas the domain movement signal line pairs of the second group are odd-numbered ones of the domain movement signal line pairs. However, example embodiments are not limited thereto. Rather, in other example embodiments, the domain movement signal line pairs of the first through the M/2-th columns may be included in the first group and the domain movement signal line pairs of the [(M/2)+1]-th through the M-th columns may be included in the second group.

According to at least this example embodiment, when the first and second domain movement control units 32 and 33 are formed to face each other with respect to the memory cell array unit 31, each of the first and second domain movement control units 32 and 33 may control half or about half of the nano wires included in the memory cell array unit 31. Accordingly, as the number of the nano wires to be controlled by each domain movement control unit decreases, the complexity of each domain movement control unit may be reduced and/or the area taken by the domain movement control unit relative to the entire area of the storage device may be reduced.

Although in this example embodiment, the memory cell 30 includes only two of the first and second domain movement control units 32 and 33, in other example embodiments, the memory cell 30 may include a number of domain movement control units corresponding to the number of the domain movement signal line pairs. The domain movement control units corresponding to the even-numbered domain movement signal line pairs may be formed relatively close to or at the first surface or side of the memory cell array unit 31, whereas the domain movement control units corresponding to the odd-numbered domain movement signal line pairs may be formed relatively close to or at the second surface or side of the memory cell array unit 31.

Figure 4A:
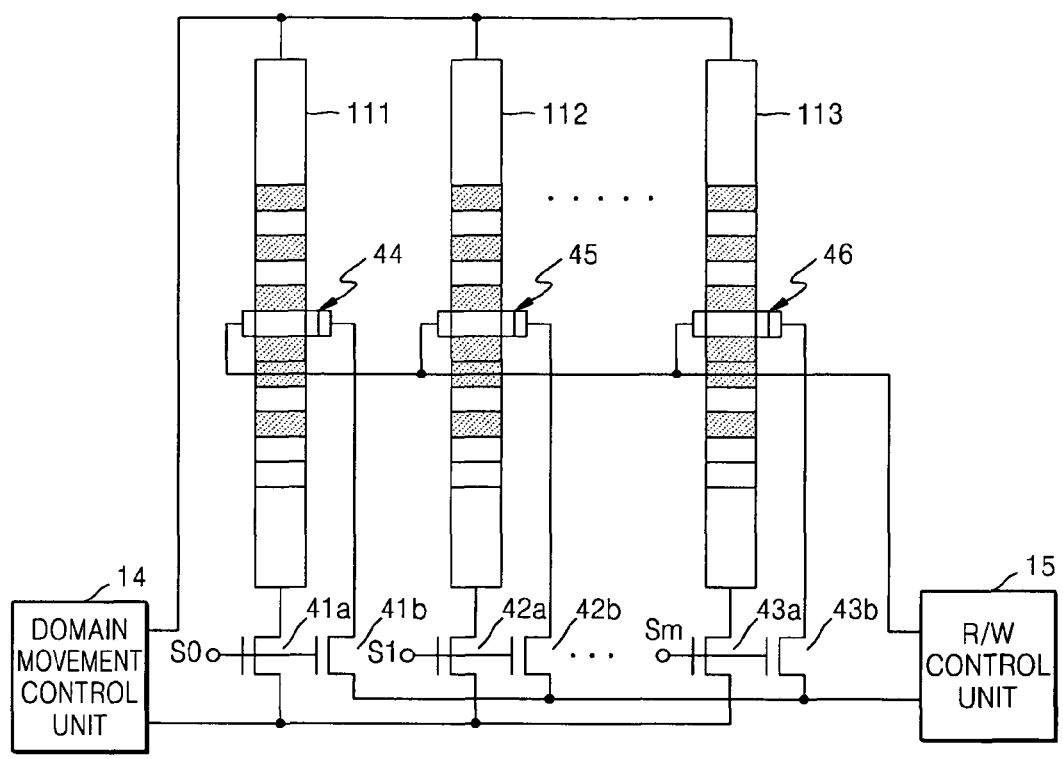
FIG. 4A is a sectional view of the area 4a of the information storage device of FIG. 1 in the longitudinal direction.

FIG. 4A is a sectional view of the area 4a of the information storage device of FIG. 1 in the longitudinal direction.

Referring to FIG. 4A, the nano wires 111, 112, and 113 of the first row of the nano wires included in the memory cell array unit 11, the domain movement control unit 14, and the R/W control unit 15 are illustrated. Read/write (R/W) units 44, 45, and 46 are respectively formed at middle portions of the nano wires 111, 112, and 113. Each of the R/W units 44, 45, and 46 includes a first electrode and a second electrode.

A plurality of domain movement transistors 41a, 42a, and 43a are formed on the substrate. The domain movement transistors 41a, 42a, and 43a are respectively located at the lower ends of the nano wires 111, 112, and 113 and share a source line in the horizontal direction. In more detail, a drain of each of the domain movement transistors 41a, 42a, and 43a is connected to the lower end of each of the nano wires 111, 112, and 113 and a gate of each of the domain movement transistors 41a, 42a, and 43a is connected to a corresponding one of selection signal lines S0, S1, . . . , Sm. A first domain movement signal line of a pair of domain movement signal lines connected to the domain movement control unit 14 is connected to the upper end of each of the nano wires 111, 112, and 113. A second domain movement signal line of the pair of domain movement signal lines is connected to the source line of each of the domain movement transistors 41a, 42a, and 43a.

Still referring to FIG. 4A, a plurality of read/write (R/W) transistors 41b, 42b, and 43b are formed on the substrate. The R/W transistors 41b, 42b, and 43b are respectively located at the lower ends of the nano wires 111, 112, and 113 and share the source line in the horizontal direction. In more detail, a drain of each of the R/W transistors 41b, 42b, and 43b is connected to the first electrode of a corresponding one of the R/W units 44, 45, and 46. A gate of each of the R/W transistors 41b, 42b, and 43b is connected to a corresponding one of the selection signal lines S0, S1, . . . , Sm. A first R/W signal line of a pair of R/W signal lines connected to the R/W control unit 15 is also connected to the second electrode of each of the R/W units 44, 45, and 46. A second R/W signal line of the pair of R/W signal lines is connected to the source line of each of the R/W transistors 41b, 42b, and 43b.

The selection signal lines connect the first and second nano wire selection units 12 and 13 to gates of the domain movement transistors 41a, 42a, and 43a and the R/W transistors 41b, 42b, and 43b. For example, the first selection signal S0 provided by the second nano wire selection unit 13 is provided to the gates of the first domain movement transistor 41a and the first R/W transistor 41b. When the first selection signal S0 is activated, the first domain movement transistor 41a and the first R/W transistor 41b are turned on so that a domain movement and/or R/W operation may be performed on the magnetic domains included in the first nano wire 111.

Although in this example embodiment the domain movement transistors 41a, 42a, and 43a and the R/W transistors 41b, 42b, and 43b are located at the lower ends of the nano wires 111, 112, and 113, example embodiments are not limited thereto. Rather, the domain movement transistors 41a, 42a, and 43a and the R/W transistors 41b, 42b, and 43b may be formed at other positions relative to the nano wires 111, 112, and 113.

Figure 4B:
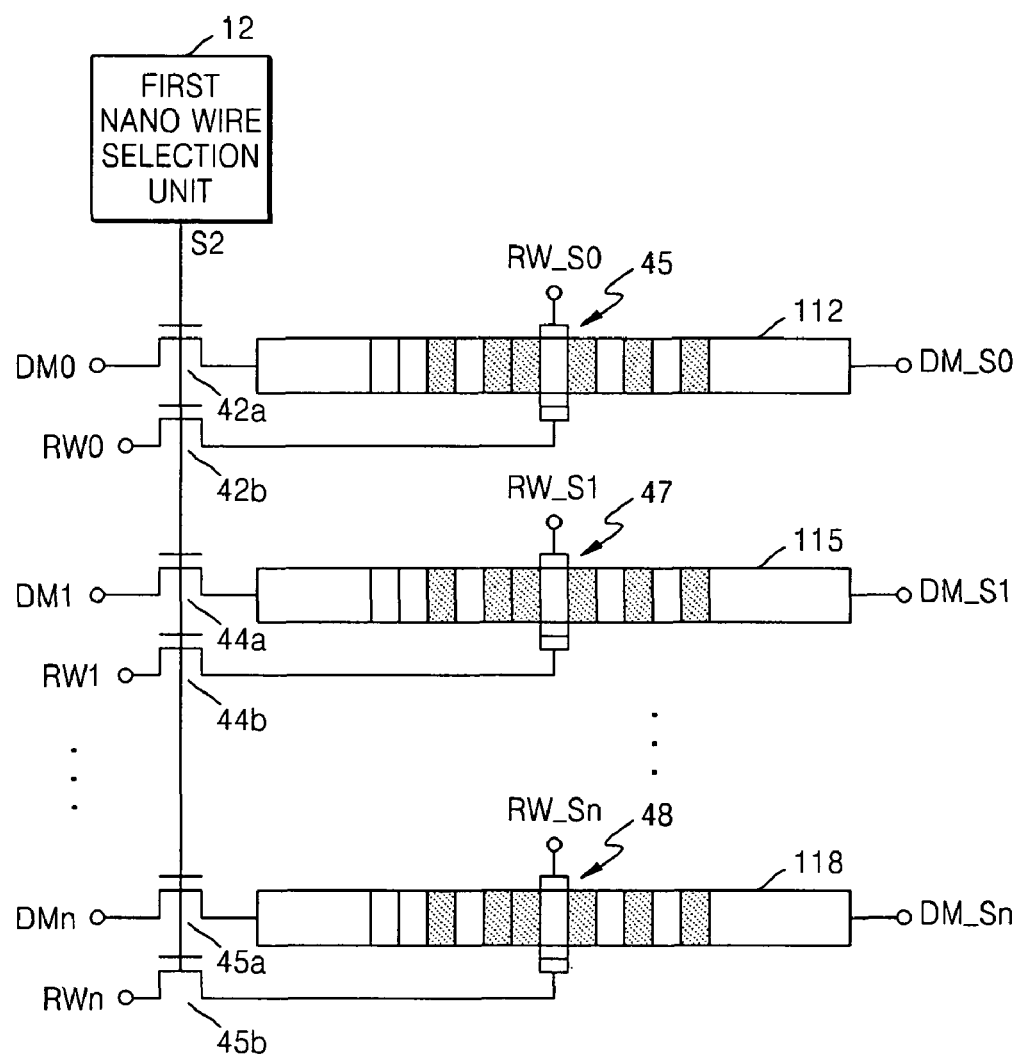
FIG. 4B is a sectional view of the area 4b of the information storage device of FIG. 1 in the latitudinal direction.

FIG. 4B is a sectional view of the area 4b of the information storage device of FIG. 1 in the latitudinal direction.

Referring to FIG. 4B, the nano wires 112, 115, and 118 of the second column of the nano wires included in the memory cell array unit 11 and the first nano wire selection unit 12 are illustrated. The R/W units 44, 45, and 46 are respectively formed at middle portions of the nano wires 112, 115, and 118. Each of the R/W units 44, 45, and 46 includes a first electrode and a second electrode.

A selection signal line connects the first nano wire selection unit 12 to gates of the domain movement transistors 42a, 44a, and 45a and the R/W transistors 42b, 44b, and 45b. The domain movement transistors and the R/W transistors connected to the nano wires of the same column share the same selection signal line. When the selection signal S2 provided by the first nano wire selection unit 12 is activated, both of the domain movement transistors 42a, 44a, and 45a and the R/W transistors 42b, 44b, and 45b are turned on so that the a domain movement and the R/W operation may be simultaneously or concurrently performed on the nano wires 112, 115, and 118 of the second column.

Still referring to FIG. 4B, drains of the domain movement control transistors 42a, 44a, and 45a are respectively connected to ends of the nano wires 112, 115, and 118. Sources of the domain movement control transistors 42a, 44a, and 45a are respectively connected to first domain movement signal lines DM0, DM1, and DMn, which are further connected to the domain movement control unit 14. Second domain movement signal lines DM_S0, DM_S1, and DM_Sn connected to the domain movement control unit 14 are also connected to corresponding other ends of the nano wires 112, 115, and 118.

Drains of the R/W control transistors 42b, 44b, and 45b are respectively connected to the first electrodes of the R/W units 45, 47 and 48 formed at the, nano wires 112, 115, and 118. Sources of the R/W control transistors 42b, 44b, and 45b are respectively connected to first R/W signal lines RW0, RW1, and RWn connected to the R/W control unit 15. Second R/W signal lines RW_S0, RW_S1, and RW_Sn connected to the R/W control unit 15 are respectively connected to the second electrodes of the R/W units 45, 47, and 48.

Figure 5:
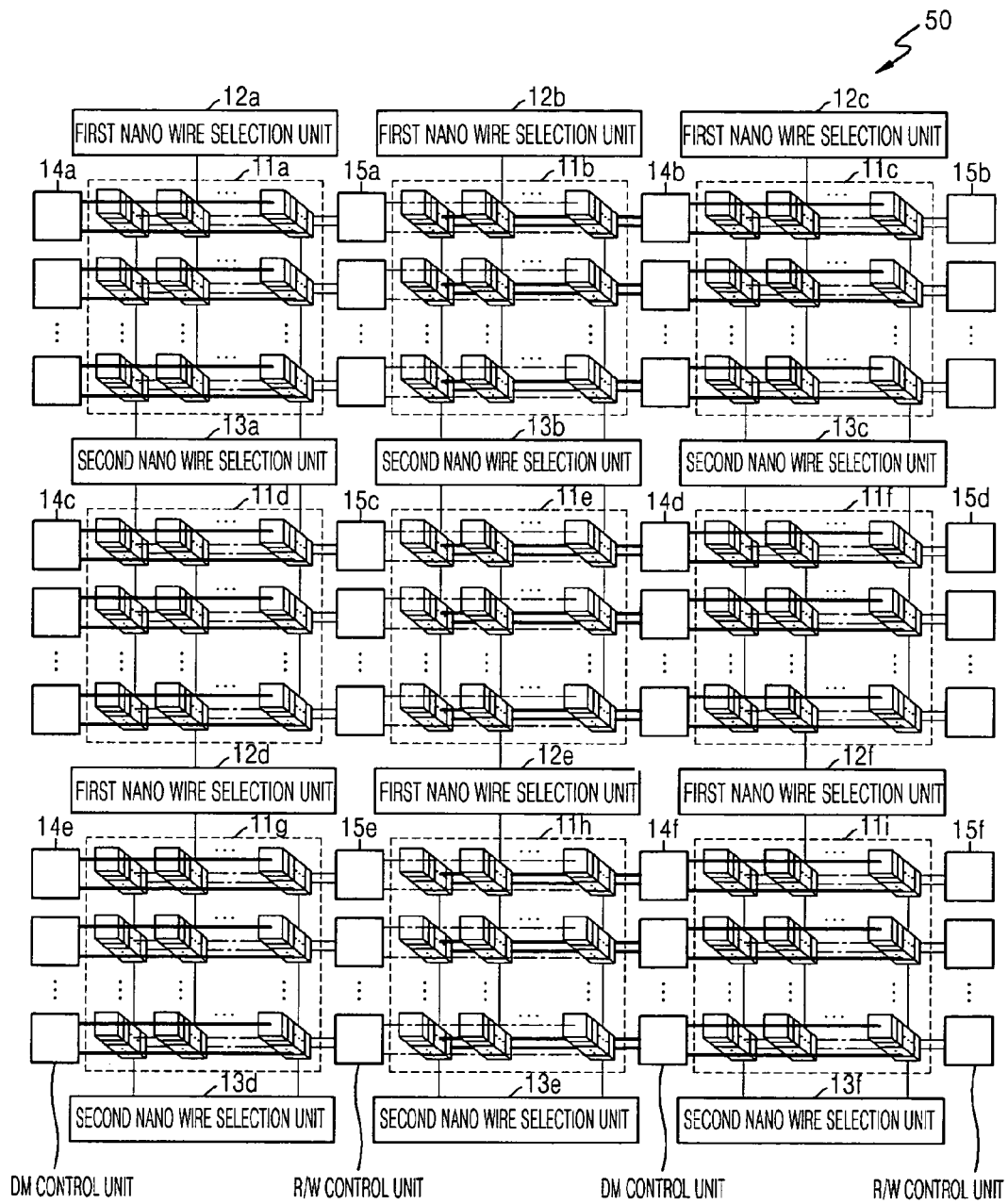
FIG. 5 illustrates a memory core unit including a plurality of memory cells according to an example embodiment.

FIG. 5 illustrates a memory core unit 50 including a plurality of memory cells according to an example embodiment.

Referring to FIG. 5, the memory core unit 50 includes: a plurality of memory cell array units 11a-11i, a plurality of first nano wire selection units 12a-12f, a plurality of second nano wire selection units 13a-13f, a plurality of domain movement (DM) control units 14a-14f, and a plurality of read/write (R/W) control units 15a-15f. The memory cell array units 11a-11i, the first nano wire selection units 12a-12f, the second nano wire selection units 13a-13f, the DM control units 14a-14f, and the read/write (R/W) control units 15a-15f are the same or substantially the same as those included in the memory cell 10 of FIG. 1. Thus, although not described in detail below, the descriptions of FIG. 1 may be equally applicable to the memory core unit 50 of this example embodiment.

In FIG. 5, the memory cell array units 11a-11i share the first nano wire selection units 12a-12f and the second nano wire selection units 13a-13f. Accordingly, each of the memory cell array units 11a-11i has a vertically symmetrical structure. For example, the memory cell array units 11a and 11d share the second nano wire selection unit 13a. The second nano wire selection unit 13a is connected to the nano wires in the odd-numbered columns of the nano wires included in the memory cell array unit 11a, and to the nano wires in the odd-numbered columns of the nano wires included in the memory cell array unit 11d, through the selection signal lines. Also, the memory cell array units 11d and 11g share the first nano wire selection unit 12d. The first nano wire selection unit 12d is connected to the nano wires in the even-numbered columns of the nano wires included in the memory cell array unit 11d, and to the nano wires in the even-numbered columns of the nano wires included in the memory cell array unit 11g, through the selection signal lines. Thus, the area taken by the first and second nano wire selection units 12d and 13a is reduced so that the area of the memory core unit 50 may be reduced.

Still referring to FIG. 5, the memory cell array units 11a-11i share the DM control units 14a-14f and the R/W control units 15a-15f. Accordingly, each of the memory cell array units 11a-11i has a horizontally symmetrical structure. For example, the memory cell array units 11a and 11b share the R/W control unit 15a, and the memory cell array units 11b and 11c share the DM control unit 14b. Thus, the area taken by the R/W control unit 15a and the DM control unit 14b is reduced so that the area of the memory core unit 50 may be reduced.

Figure 6:
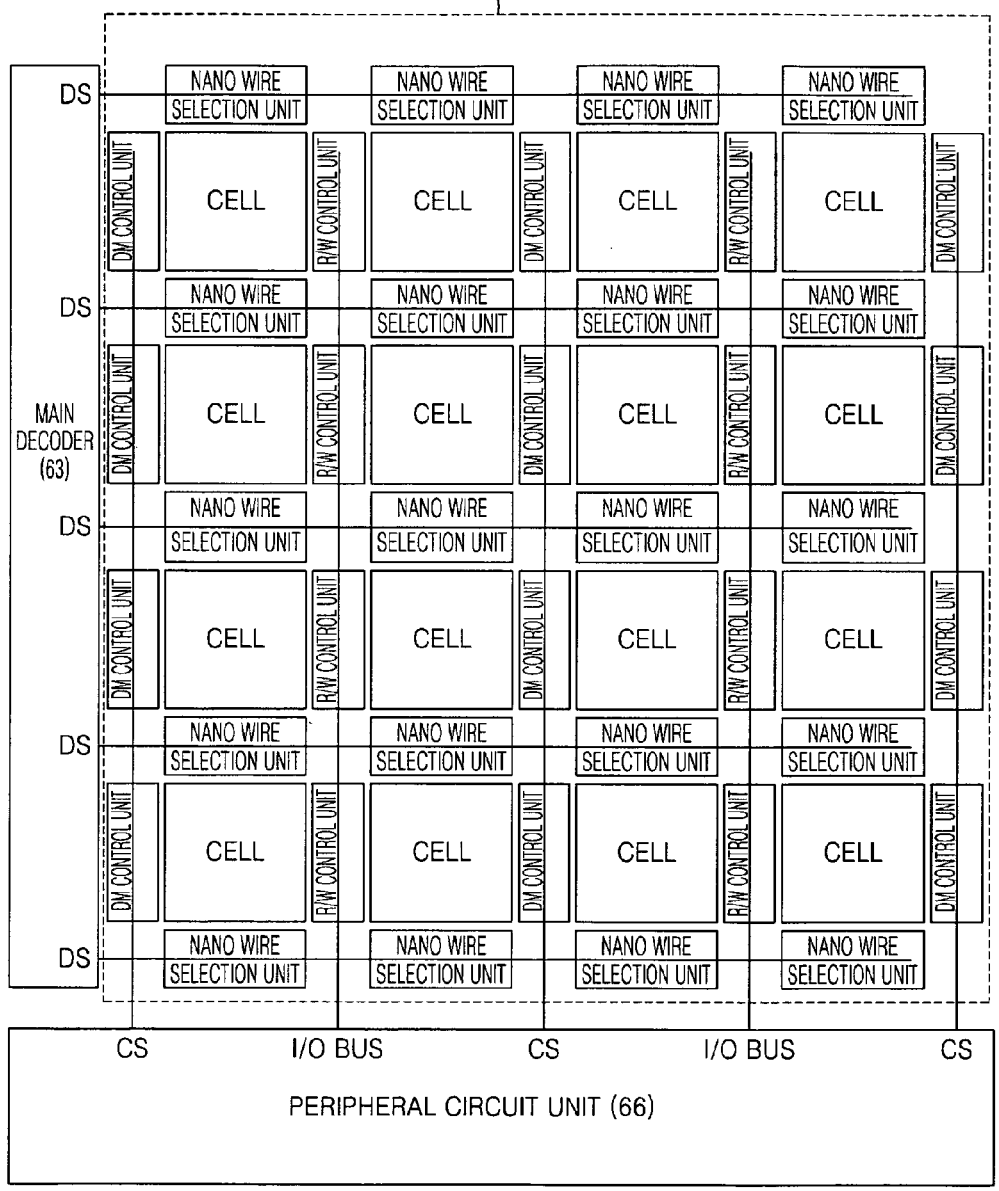
FIG. 6 schematically illustrates an example embodiment of an information storage device including the memory core unit of FIG. 5.

FIG. 6 schematically illustrates an example embodiment of an information storage device 60 including the memory core unit 50 of FIG. 5.

Referring to FIG. 6, the information storage device 60 includes: the memory core unit 50, a main decoder 63, and a peripheral circuit unit 66. The main decoder 63 provides a decoding signal DS to the nano wire selection units included in the memory core unit 50. The peripheral circuit unit 66 provides a control signal CS to the domain movement control unit included in the memory core unit 50 and is connected to the R/W control units via an input/output (I/O) bus.

According at least this example embodiment, the memory cell array units included in the information storage device 60 share the nano wire selection unit, the domain movement control unit, and the R/W control unit with the neighboring memory cells. Thus, a degree of integration is improved so that a relatively large capacity information storage device may be realized.

Figure 7:
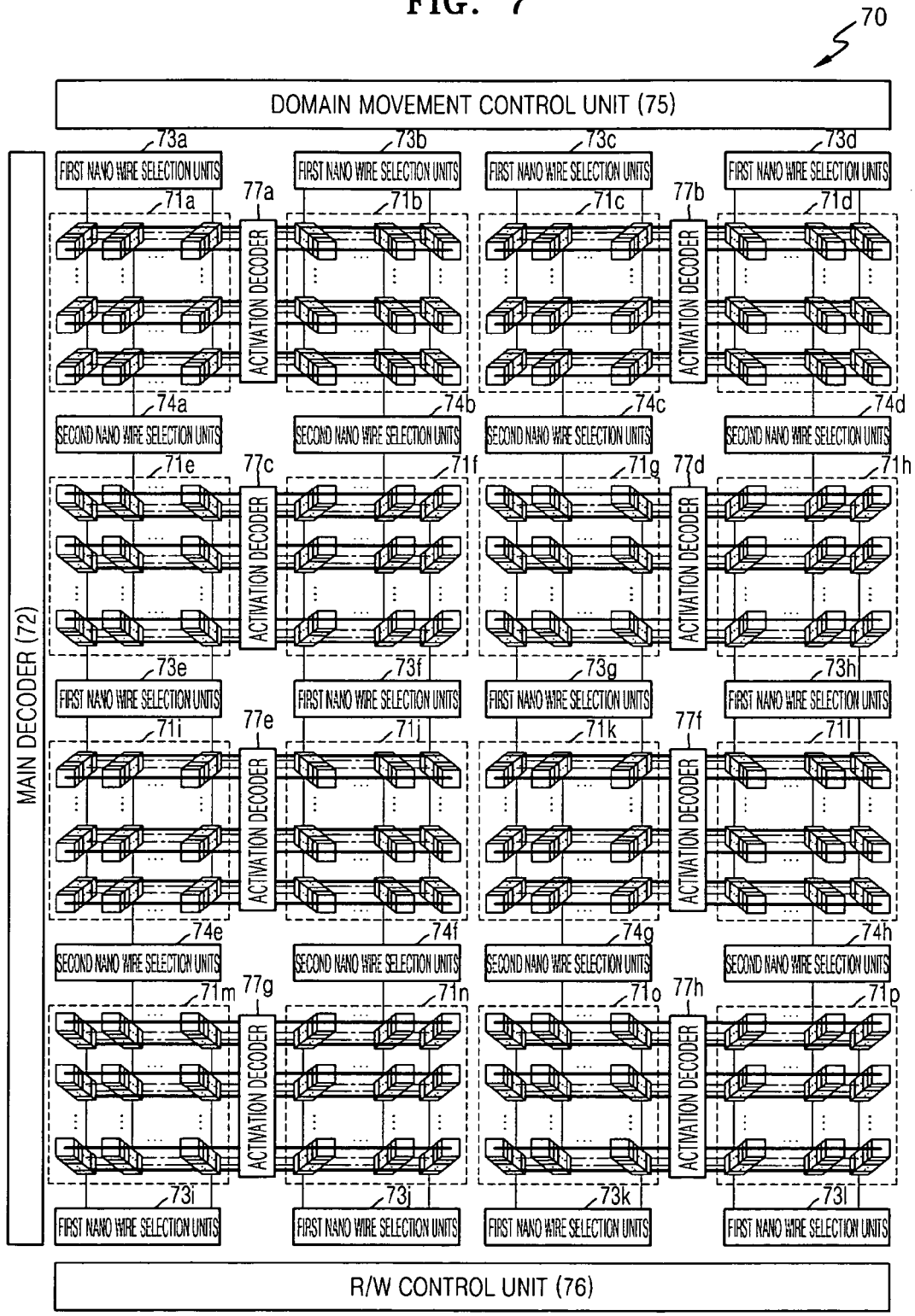
FIG. 7 illustrates a memory core unit including a plurality of memory cells according to an example embodiment.

FIG. 7 illustrates a memory core unit 70 including a plurality of memory cells according to an example embodiment.

Referring to FIG. 7, the memory core unit 70 includes: a plurality of memory cell array units 71a-71p, a main decoder 72, a plurality of first nano wire selection units 73a-73l, a plurality of second nano wire selection units 74a-74h, a domain movement control unit 75, a read/write (R/W) control unit 76, and a plurality of activation decoders 77a-77h.

The memory cell array units 71a-71p share the first nano wire selection units 73a-73l and the second nano wire selection units 74a-74h. Thus, each of the memory cell array units has a vertically symmetrical structure. Also, the memory cell array units 71a-71p share the activation decoders 77a-77h. Thus, each of the memory cell array units has a horizontally symmetrical structure. Because the information storage device 70 includes the activation decoders 77a-77h, and thus, each memory cell array unit does not separately require a domain movement control unit and a R/W control unit, the area of the information storage device 70 may be reduced.

Still referring to FIG. 7, the main decoder 72 provides a decoding signal to the first nano wire selection units 73a-73l and the second nano wire selection units 74a-74h. The domain movement control unit 75 provides a domain movement signal to the activation decoders 77a-77h. The activation decoders 77a-77h may perform first decoding on the domain movement signal provided by the domain movement control unit 75 and provide the decoded domain movement signal to the nano wires included in each memory cell array unit. The R/W control unit 76 provides an R/W signal to the activation decoders 77a-77h. The activation decoders 77a-77h may perform first decoding on the R/W signal provided by the R/W control unit 76 and provide the decoded R/W signal to the nano wires included in each memory cell array unit.

Figure 8:
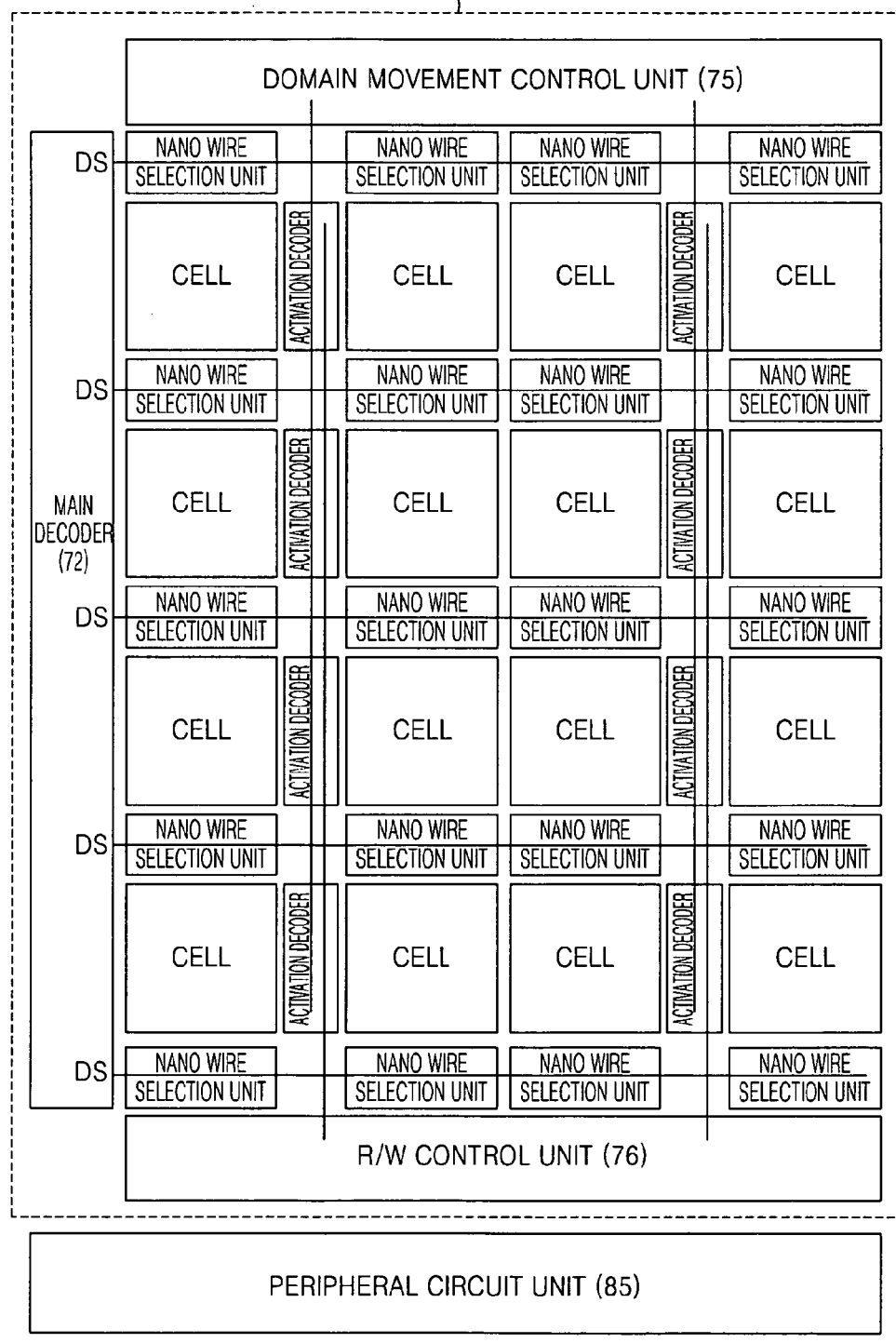
FIG. 8 schematically illustrates an example embodiment of an information storage device including the memory core unit of FIG. 7.

FIG. 8 schematically illustrates an example embodiment of an information storage device 80 including the memory core unit 70 of FIG. 7.

Referring to FIG. 8, the information storage device 80 includes: a memory core unit 70 and a peripheral circuit unit 85. According to at least this example embodiment, because the memory cell array units included in the information storage device 80 share the nano wire selection unit and the activation decoder with the neighboring memory cells, a degree of integration is improved so that a relatively large capacity information storage device may be realized. Furthermore, because the domain movement control unit and the R/W control unit need not be provided at each memory cell array unit, a degree of integration may be further improved.

Figure 9:
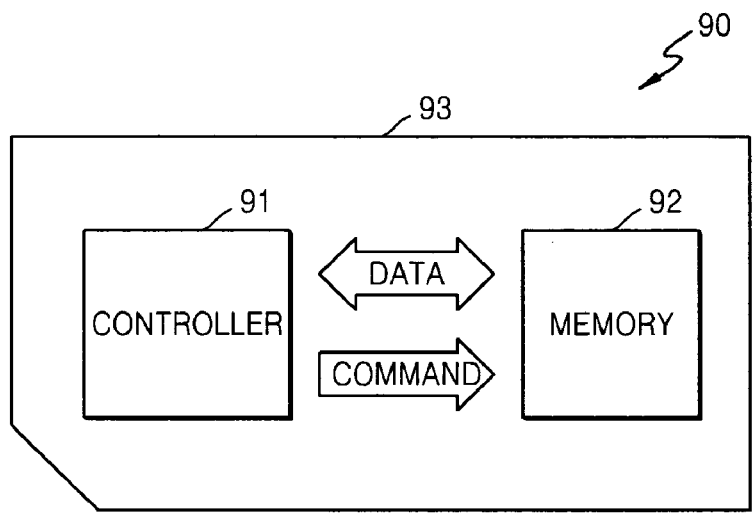
FIG. 9 is a schematic diagram of a memory card according to an example embodiment.

FIG. 9 is a schematic diagram of a memory card 90 according to an example embodiment.

Referring to FIG. 9, the memory card 90 includes: a controller 91 and a memory unit 92, which are located in a housing 93. The controller 91 and the memory unit 92 are configured to exchange electric signals with each other. For example, according to a command by the controller 91, the memory unit 92 and the controller 91 may exchange data with each other. The memory card 90 may store data in the memory unit 92 or output the data from the memory unit 92.

The memory unit 92 may include at least one of the information storage devices of FIGS. 1-8. The memory card 90 may be used as a variety of data storage media in portable devices. For example, the memory card 90 may include a multimedia card (MMC), a security digital (SD) card, etc.

Figure 10:
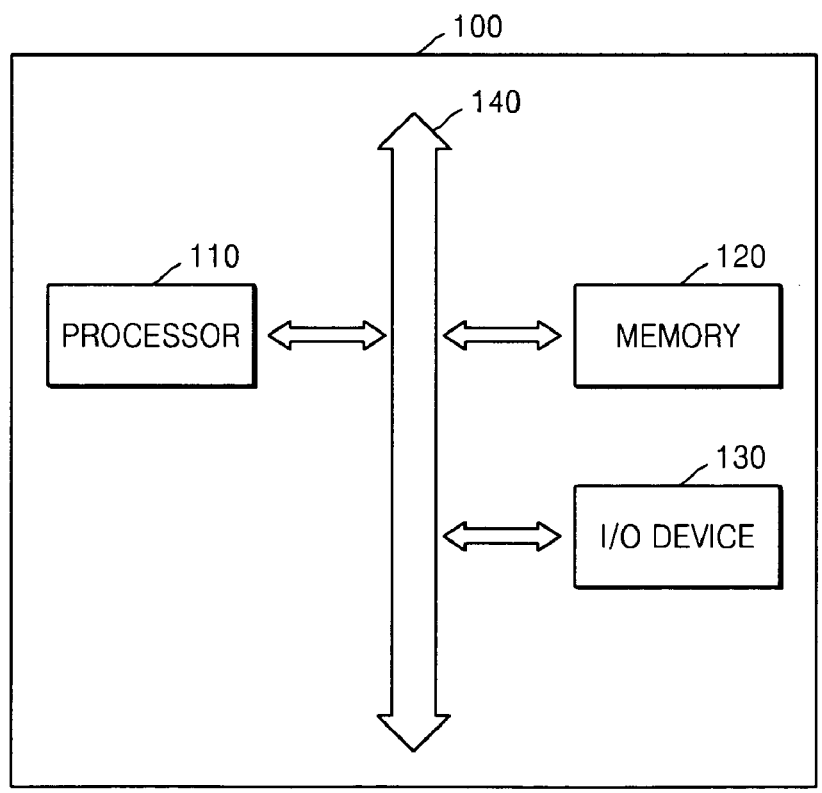
FIG. 10 is a block diagram of an electronic system according to an example embodiment.

FIG. 10 is a block diagram of an electronic system 100 according to an example embodiment.

Referring to FIG. 10, the electronic system 100 includes: a processor 110, a memory unit 120, and an input/output (I/O) device 130, which may exchange data with one another through a bus 140. The processor 110 is configured to execute a program and control the system 100. The I/O device 130 is configured to be used to input or output data of the system 100. The system 100 may be connected to an external device such as a personal computer or a network by using the I/O device 130 to exchange data with the external device. The memory unit 120 is configured to store codes and data for the operation of the processor 110. The memory unit 120 may include at least one of the information storage devices of FIGS. 1-8.

The electronic system 100 may constitute a variety of electronic control devices requiring memory. Examples of the electronic system 100 are: mobile phones, MP3 players, navigations, solid state disks (SSDs), household appliances, etc.

As described above, according to the one or more example embodiments, because one of the nano wire selection unit, the domain control unit, and the R/W control unit is separated into two parts with respect to the memory cell array unit including a plurality of vertical nano wires to be arranged to face each other, and each nano wire selection unit, each domain movement control unit, or each R/W control unit controls only a portion of the nano wires included in the memory cell array unit, the complexity of each nano wire selection unit, each domain movement control unit, or each R/W control unit may be reduced.

Also, according to one or more example embodiments, because the memory cell array units included in the information storage device share the nano wire selection unit, the domain movement control unit, and the R/W control unit with the neighboring memory cells, a degree of integration may be improved and/or a relatively large capacity information storage device may be realized. Furthermore, the memory cell array units included in the information storage device need not include the domain movement control unit and the R/W control unit for each cell array unit, but includes the activation decoder to perform first decoding on the domain movement signal and the R/W signal, a degree of integration may be further improved.

Although example embodiments are discussed herein with regard to the term 'unit' (e.g., memory cell array unit, nano wire selection unit, etc.), these components may also be referred to as circuits (e.g., memory cell array circuit, nano wire selection circuit, etc.).

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. A memory cell comprising:
   a memory cell array unit including a plurality of nano wires arranged vertically on a substrate, each of the plurality of nano wires having a plurality of domains for storing information;
   a nano wire selection unit formed on the substrate, the nano wire selection unit being configured to select at least one of the plurality of nano wires;

a domain movement control unit formed on the substrate and configured to control a domain movement operation with respect to at least one of the plurality of nano wires; and a read/write control unit formed on the substrate and configured to control at least one of a read operation and a write operation with respect to at least one of the plurality of nano wires.

2. The memory cell of claim 1, wherein the nano wire selection unit is configured to provide a selection signal to the plurality of nano wires through a plurality of selection signal lines, the domain movement control unit is configured to provide a domain movement signal to the plurality of nano wires through a plurality of domain movement signal lines, and the read/write control unit is configured to provide a read/write signal to the plurality of nano wires through a plurality of read/write signal lines, and wherein the selection signal is for selecting at least one of the plurality of nano wires, the domain movement signal is for controlling the domain movement operation of at least one of the plurality of nano wires, and the read/write signal is for controlling at least one of the read operation and the write operation with respect to at least one of the plurality of nano wires.

3. The memory cell of claim 2, wherein the plurality of selection signal lines are arranged vertically with respect to the plurality of read/write signal lines.

4. The memory cell of claim 2, wherein the plurality of selection signal lines are arranged vertically with respect to the plurality of domain movement signal lines.

5. The memory cell of claim 2, wherein the plurality of domain movement signal lines are arranged vertically with respect to the plurality of read/write signal lines.

6. The memory cell of claim 2, wherein the nano wire selection unit comprises:

a first nano wire selection unit arranged at a first side of the memory cell array unit and connected to selection signal lines of a first group of the plurality of selection signal lines; and a second nano wire selection unit arranged at a second side of the memory cell array unit and connected to selection signal lines of a second group of the plurality of selection signal lines; wherein the second nano wire selection unit is not connected to the selection signal lines in the first group of the plurality of selection signal lines, and the first side and the second side face each other with respect to the memory cell array unit.

7. The memory cell of claim 6, wherein the selection signal lines of the first group and the selection signal lines of the second group are arranged alternately, wherein the selection signal lines of the first group are even-numbered selection signal lines, and the selection signal lines of the second group are odd-numbered selection signal lines.

8. The memory cell of claim 2, wherein the domain movement control unit comprises:

a first domain movement control unit arranged at a first side of the memory cell array unit and connected to domain movement signal lines of a first group of the plurality of domain movement signal lines; and a second domain movement control unit arranged at a second side of the memory cell array unit and connected to domain movement signal lines of a second group of the plurality of domain movement signal lines; wherein the second domain movement control unit is not connected to the domain movement signal lines of the first group of the plurality of domain movement signal lines, and the first side and the second side face each other with respect to the memory cell array unit.

9. The memory cell of claim 8, wherein the domain movement signal lines of the first and second groups are arranged alternately, wherein the domain movement signal lines of the first group are even-numbered domain movement signal lines, and the domain movement signal lines of the second group are odd-numbered domain movement signal lines.

10. The memory cell of claim 2, wherein the read/write control unit comprises:

a first read/write control unit arranged at a first side of the memory cell array unit and connected to read/write signal lines of a first group of the plurality of read/write signal lines; and a second read/write control unit arranged at a second side of the memory cell array unit and connected to read/write signal lines of a second group of the plurality of read/write signal lines; wherein the second read/write control unit is not connected to the read/write signal lines of the first group, and the first side and the second side face each other with respect to the memory cell array unit.

11. The memory cell of claim 10, wherein the read/write signal lines of the first and second groups are arranged alternately, wherein the read/write signal lines of the first group are even-numbered read/write signal lines of the plurality of read/write signal lines, and the read/write signal lines of the second group are odd-numbered read/write signal lines of the plurality of read/write signal lines.

12. The memory cell of claim 1, further comprising:

a plurality of domain movement transistors formed on the substrate and connected to each of the plurality of nano wires, sources of the plurality of domain movement transistors sharing a first source line; and a plurality of read/write transistors formed on the substrate and connected to each of the plurality of nano wires, sources of the plurality of read/write transistors sharing a second source line.

13. The memory cell of claim 12, wherein the nano wire selection unit is configured to provide a selection signal to nano wires of at least one column of the plurality of nano wires and configured to activate, at least one of simultaneously and concurrently, the plurality of domain movement transistors and the plurality of read/write transistors connected to each of the nano wires of the at least one column, wherein the selection signal is for selecting at least one of the plurality of nano wires.

14. The memory cell of claim 1, wherein the domains included in each of the plurality of nano wires are arranged parallel to the substrate.

15. An information storage device comprising:

a memory core unit including a plurality of memory cells of claim 1; and a peripheral circuit unit connected to the memory core unit.

16. The information storage device of claim 15, wherein pairs of a plurality of memory cell array units share one of a plurality of nano wire selection units in a first direction, and pairs of the plurality of memory cell array units share one of a plurality of domain movement control units or one of a plurality of read/write control units in a second direction, wherein the second direction is perpendicular to the first direction.

17. An information storage device comprising:
a memory core unit including a plurality of memory cells of claim 1; and
a peripheral circuit unit connected to the memory core unit; wherein
the memory core unit further includes a plurality of activation decoders.

18. The information storage device of claim 17, wherein the plurality of activation decoders perform decoding of at least one of the domain movement control signal and the read/write signal, and provide a decoded signal to a corresponding memory cell array unit.

19. The information storage device of claim 17, wherein pairs of a plurality of memory cell array units share one of a plurality of nano wire selection units in a first direction, and pairs of the plurality of memory cell array units share one of the plurality of activation decoders in a second direction, wherein
the second direction is perpendicular to the first direction.

20. A memory card comprising:
a memory unit including the memory cell of claim 1; and
a controller unit configured to control the memory unit.

21. An electronic system comprising:
a memory unit including the memory cell of claim 1;
a processor unit configured to communicate with the memory unit via a bus; and
an input/output device configured to communicate with the bus.

\* \* \* \* \*